(12) United States Patent
Lin et al.

(10) Patent No.: US 11,404,539 B2
(45) Date of Patent: Aug. 2, 2022

(54) APPARATUS FOR EXTENSION OF OPERATION VOLTAGE

(71) Applicant: NXP USA, Inc., Austin, TX (US)

(72) Inventors: Xin Lin, Phoenix, AZ (US); Ronghua Zhu, Chandler, AZ (US); Xu Cheng, Chandler, AZ (US); Yujing Wu, Chandler, AZ (US); Zhihong Zhang, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 17/002,083

(22) Filed: Aug. 25, 2020

(65) Prior Publication Data
US 2022/0069077 A1   Mar. 3, 2022

(51) Int. Cl.
| | |
|---|---|
| H01L 29/06 | (2006.01) |
| H01L 21/762 | (2006.01) |
| H01L 27/088 | (2006.01) |
| H01L 29/66 | (2006.01) |
| H01L 29/78 | (2006.01) |
| H01L 27/12 | (2006.01) |
| H01L 29/40 | (2006.01) |
| H01L 29/10 | (2006.01) |

(52) U.S. Cl.
CPC .... *H01L 29/0653* (2013.01); *H01L 21/76224* (2013.01); *H01L 27/088* (2013.01); *H01L 29/66681* (2013.01); *H01L 29/7816* (2013.01)

(58) Field of Classification Search
CPC .......... H01L 29/66568–66659; H01L 29/66681–66704; H01L 29/7816–7826; H01L 23/58; H01L 23/585; H01L 23/60; H01L 27/0248; H01L 27/0251; H01L 27/0266; H01L 27/027; H01L 29/7812; H01L 29/7824; H01L 29/06–0661
See application file for complete search history.

(56) References Cited

U.S. PATENT DOCUMENTS

| | | |
|---|---|---|
| 9,231,083 B2 | 1/2016 | Yang et al. |
| 9,373,712 B2 | 6/2016 | Wang et al. |
| 9,543,379 B2 | 1/2017 | Yang et al. |
| 9,728,600 B2 | 8/2017 | Yang et al. |
| 10,461,182 B1 | 10/2019 | Edwards et al. |
| 2016/0099341 A1 | 4/2016 | Yang et al. |
| 2018/0218936 A1 | 8/2018 | Wada et al. |

*Primary Examiner* — Sonya McCall-Shepard

(57) ABSTRACT

A device (100) includes a substrate (101-106) with an upper semiconductor layer, buried semiconductor layer, and a DTI structure (107-108) defining an active device region; a dummy LDMOS device (121) in the active device region which includes a grounded drain (D1) in a drift region (105), a source (S1, S2) in a body region (109) which extends to contact the buried semiconductor layer, a gate electrode (G1-G4) formed so that the source and at least part of the gate electrode are connected with the body implant region, and a buffering semiconductor layer portion (104) adjacent the DTI structure; and one or more active LDMOS devices (122) positioned in the active device region to be separated from the DTI structure by the dummy LDMOS device (121) which reduces an electric field across the sidewall insulator layer (107) in the DTI structure.

12 Claims, 4 Drawing Sheets

APPARATUS FOR EXTENSION OF OPERATION VOLTAGE

BACKGROUND OF THE INVENTION

Field of the Invention

The present invention is directed in general to integrated circuit devices and methods for manufacturing same. In one aspect, the present invention relates to the manufacture and use of lateral double-diffused metal-oxide-semiconductor (LDMOS) transistor devices.

Description of the Related Art

High-voltage integrated circuits applications, such as high-voltage smart power applications, are constructed with integrated circuit MOS field effect transistor devices which must be able to sustain high voltages (e.g., forty-five volts or greater) across the transistor device's source and drain terminals. With such high-voltage applications, lateral diffused metal-oxide-semiconductor (LDMOS) transistor devices are often used to provide the high-voltage operation. But such LDMOS devices usually require thick and low-doped epitaxial layer, which makes them difficult to integrate with low-voltage circuitry on the same chip. To enhance the density of integration and electrical isolation robustness when integrating LDMOS devices with low-voltage circuitry on the same chip, deep trench isolation (DTI) structures are included to separate and isolate the LDMOS devices, with some types of DTI structures being constructed to include a heavily doped n-type poly plug surrounded by insulating dielectric layers. In semiconductor-on-insulator (SOI) technologies, the poly plug typically functions as the substrate tie and is thus grounded all the time. As a result, a large electric field may be present across the insulating dielectric layers between the poly plug and the high voltage terminal adjacent to the DTI structure. As process technologies may provide DTI structure designs that are optimized for the operation up to a first voltage level (e.g., 98V), the desire to increase the operation voltages (e.g., to 106V, 114V, and further to 122V) for certain high voltage applications, the existing DTI structure designs may not be able to sustain the higher operational voltages, resulting in time dependent dielectric breakdown (TDDB) failure for the insulating dielectric layers in the DTI structures. While this issue can be addressed by increasing the thickness of the DTI structure's insulating dielectric layers, such changes in the process module usually require a long development cycle and could lead to other process issues. While there are examples of dummy gate layout designs where the drains of dummy gate devices are shorted with the drains of active devices for purposes of improving matching and uniformity, such dummy gate devices typically have the same design as the active devices, and are implemented by placing two, four, or more dummy gates that can impose a significant area penalty.

As seen from the foregoing, the existing solutions for integrating LDMOS devices may be extremely difficult at a practical level by virtue of the challenges with balancing tradeoffs posed between providing higher operational voltage applications for LDMOS devices to meet the applicable performance, design, complexity and cost constraints without changing the process steps or otherwise degrading other important device properties. There is also a need for a high-voltage transistor device and fabrication processes to overcome the problems in the art, such as outlined above.

Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description is considered in conjunction with the following drawings.

Figure 1:
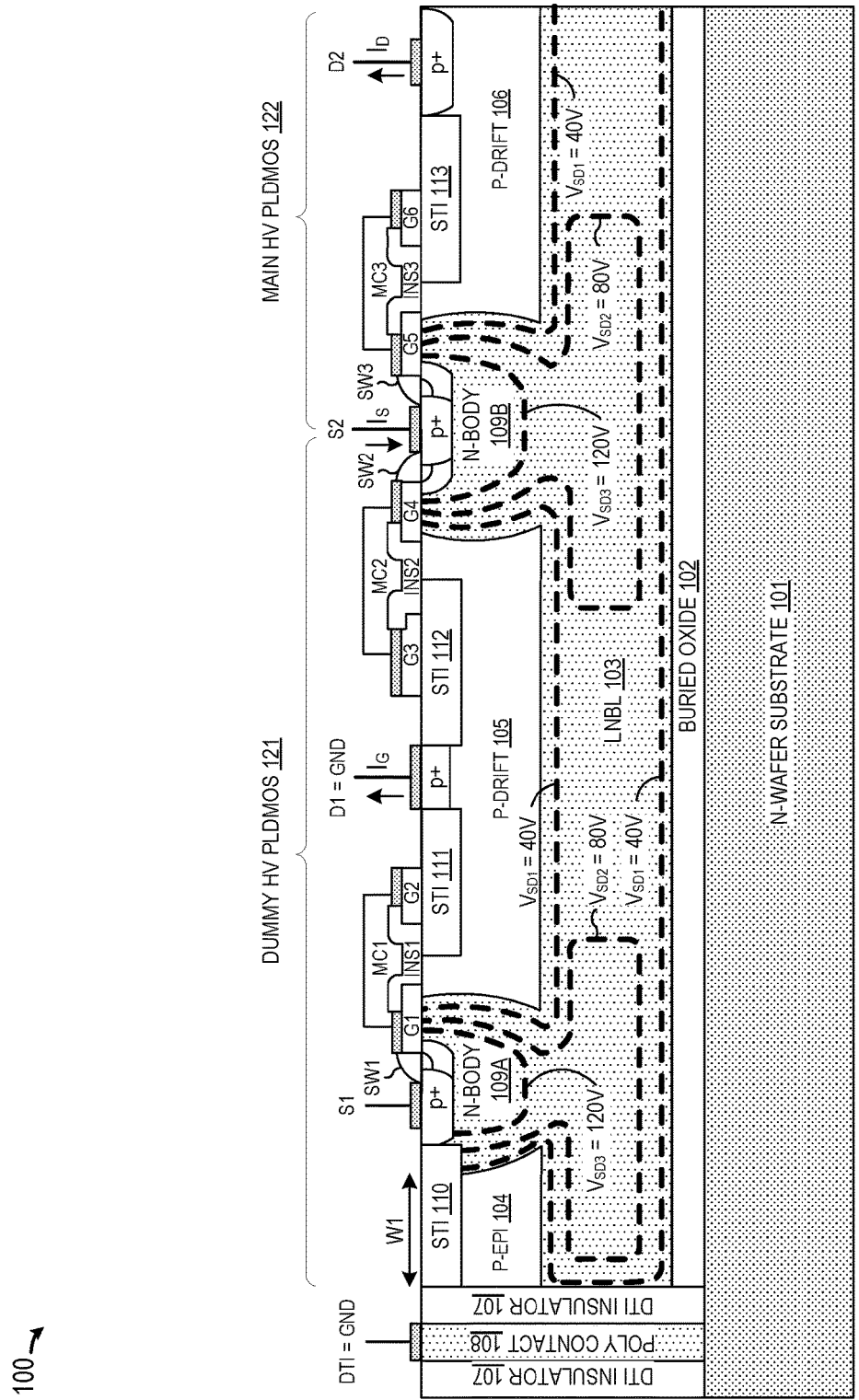
FIG. 1 is a simplified cross-sectional view of a high voltage lateral-diffused-metal-oxide-semiconductor (LDMOS) dummy device for extending the operation voltage of a main high voltage PLDMOS device in accordance with selected embodiments of the present disclosure.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

A high voltage dummy P-channel laterally-diffused MOS (LDMOS) transistor and buffering p-epi layer is described for use with high voltage (e.g., approximately 50-200V) smart power applications by positioning the dummy PLDMOS transistor(s) and buffering p-epi layer between an array of main PLDMOS transistors and the surrounding deep trench isolation (DTI) structures to extend the operation voltage of the array of main PLDMOS transistors Formed as a ring adjacent to the DTI structure, the dummy PLDMOS transistors and buffering p-epi layer are positioned and connected to reduce the electric field across the DTI sidewall by tying the gate, source and body of the dummy PLDMOS transistors to the source and body of the array of PLDMOS transistors and by tying the drain of the dummy PLDMOS transistor to ground. In such a configuration, the dummy PLDMOS transistors are always OFF. In selected embodiments, the disclosed dummy PLDMOS transistor and the main PLDMOS transistors may be similarly constructed and have similar breakdown voltages, though the dummy PLDMOS transistors may have different placement, size and structure of the gate flap to achieve a high breakdown voltage. As disclosed herein, a "dummy" PLDMOS transistor refers to the limited functionality of the device as compared to an active PLDMOS transistor that results from the electrical connection of the terminals of the dummy PLDMOS transistor, where the feature geometries of the dummy and active LDMOS transistors are otherwise the same.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid limiting or obscuring the present invention. Such descriptions and representations are used by those skilled in the art to describe and convey the substance of their work to others skilled in the art. In addition, although specific example materials are described herein, those skilled in the art will recognize that other materials with similar properties can be substituted without loss of function. It is also noted that, throughout this detailed description, certain materials will be formed and removed to fabricate the semiconductor structure. Where the specific procedures for forming or removing such materials are not detailed below, conventional techniques to one skilled in the art for growing, depositing, removing or otherwise forming such layers at appropriate thicknesses shall be intended. Such details are well known and not considered necessary to teach one skilled in the art of how to make or use the present invention.

To provide additional details for an improved understanding of selected embodiments of the present disclosure, reference is now made to FIG. 1 which depicts a simplified cross-sectional view 100 of a high voltage lateral-diffused-metal-oxide-semiconductor (LDMOS) dummy device 121 which is positioned between a deep trench isolation structure 107-108 and a main high voltage PLDMOS device 122 to extend the operation voltage of the main high voltage PLDMOS device 122 by reducing the electric fields generated across the DTI insulator 107 during high voltage operations. The depicted LDMOS dummy device 121 and main device 122 are formed with different semiconductor materials having P-type conductivity and N-type conductivity. With the P-type materials, the dopant concentrations vary from lowest dopant concentrations (P−), higher dopant concentration (P), even higher dopant concentration (P+), and the highest dopant concentration (P++). Similarly, the dopant concentrations for the N-type materials vary from lowest dopant concentrations (N), higher dopant concentration (N+), and the highest dopant concentration for (N++).

For example, the depicted LDMOS dummy device 121 and main device 122 may be p-type LDMOS devices formed on or as part of a semiconductor-on-insulator (SOI) wafer 101-113 or on or as part of a bulk semiconductor substrate or other substrate in which one or more additional semiconductor layers and/or well regions are formed using epitaxial semiconductor growth and/or selective doping techniques as described more fully hereinbelow. For example, the SOI wafer substrate 101-113 may include an n-type wafer substrate 101, a buried oxide or insulator layer 102, a lightly doped n-type buried layer (LNBL) 103, and p-type semiconductor epitaxial substrate layer which is constituted with the p-epi layer 104 and p-drift layers 105, 106. The n-wafer substrate 101 may be provided as a handling wafer layer formed of a material having first conductivity type impurities, such as an n-type wafer substrate 101, at a predetermined doping level and depth by using any suitable dopant type and/or concentration. On the handling wafer substrate 101, an insulator layer 102 and thin substrate semiconductor seed layer may be formed to provide a seed layer for thick epitaxial growth of the p-type semiconductor substrate layer 104-106, followed by implantation of the lightly doped n-type buried layer (LNBL) 103, thereby forming the initial SOI substrate structure 101-106. In another embodiment, the lightly doped n-type buried layer (LNBL) 103 is formed on the buried oxide layer 102 using an n-type seed layer and any suitable epitaxial growth process, followed by formation of the p-type semiconductor substrate layer 104-106 with a second epitaxial growth process. Alternatively, the SOI wafer substrate structure 101-106 may be formed by bonding a donor wafer to a handle wafer. With this technique, the n-type wafer substrate 101 and at least part of the buried dielectric layer 102 are provided as a handle wafer which is bonded or otherwise attached to a donor wafer which includes part of the buried dielectric layer 102, the LNBL layer 103, and the p-type semiconductor layer 104-106 which may be formed in whole or in part as a p-type epitaxial layer. Alternatively and depending on the type of transistor being fabricated, the semiconductor substrate may be implemented as a bulk silicon substrate, single crystalline silicon (doped or undoped), SOI substrate, or any semiconductor material including, for example, Si, SiC, SiGe, SiGeC, Ge, GaAs, InAs, InP, as well as other III/V or II/VI compound semiconductors or any combination thereof. With selected bulk silicon substrate embodiments, the buried insulation layer 102 may be formed by implanting some species (e.g., oxygen) at a predetermined energy and depth in the substrate 101, followed by an oxidation process.

In the SOI wafer substrate 101-106, an isolation structure around the active device area includes deep trench isolation (DTI) structures 107, 108 and/or the buried insulation layer 102, alone or in combination with patterned shallow trench isolation (STI) structures 110-113. As will be appreciated, any desired technique may be used to etch and at least partially fill the trench openings with one or more dielectric (and semiconductor) materials. For example, the deep trench isolation structure 107, 108 may be formed in the SOI wafer substrate 101-106 to surround and isolate the various well regions and active areas in the integrated circuit device 100. In selected embodiments, the deep trench isolation structures 107, 108 are formed using one or more etch masks to etch deep trench openings through the underlying p-epi layer 104-106, LNBL layer 103, and buried insulation layer 102 (e.g., by applying anisotropic etching to patterned trench etch mask layer) to reach the underlying n-wafer substrate 101. Once the deep trench openings are formed, they are typically lined with one or more insulator layers 107 (e.g., oxide), and then the centers are filled with heavily doped n-type polysilicon 108 to provide a conductive contact path from the surface to the underlying substrate 101. In similar fashion, the STI structures 110-113 may be formed by patterning and etching shallow trench openings in the upper surface of the p-epi layer 104-106, filling the openings with one or more insulating dielectric layers, and then polishing or planarizing the filling layers down to the surface of the substrate to form the shallow trench isolation (STI) structures 110-113.

Either before or after forming the STI structures 110/113, n-type sinker well or body regions 109A, 109B are formed in the SOI wafer substrate 101-106 to contact the LNBL layer 103 so that the subsequently formed source and gate regions of the HV LDMOS dummy device 121 can be tied through the n-type body 109A and LNBL layer 103 to the n-type body 109B of the active HV PLDMOS device 122. The n-type sinker well or body regions 109A, 109B may be formed by using an implant mask to selectively diffuse or implant n-type impurities into the underlying p-epi layer 104-106 to a predetermined implant energy and dopant concentration so as to be located in an upper portion of the p-epi layer 104-106. As formed, the n-type sinker well or body regions 109A, 109B define a buffering p-epi layer 104 adjacent to the DTI structure 107/108, along with a p-drift regions 105, 106 that are enclosed by the n-body implants 109A, 109B on the side and the LNBL layer 103 underneath.

Either before or after forming the DTI structures 107/108 and/or STI structures 110/113, additional gate electrodes and well, source/drain, and contact regions may be formed in the SOI wafer substrate 101-113 using any suitable deposition, pattern, mask, etch, and/or implantation steps. For example, a gate dielectric layer and conductive polysilicon layer may be sequentially formed and then selectively masked, patterned, and etched to form gate electrodes (G1-G6) over the SOI wafer substrate 101-113. In addition, one or more insulator layers may be deposited over the gate electrodes (G1-G6) and SOI wafer substrate 101-113, and then selectively masked, patterned, and etched to form sidewall implant masks (SW1-3) and split-gate separators (INS1-3) adjacent to the gate electrodes (G1-G6). Additional processing steps are performed after forming the gate electrodes (G1-G6), sidewall implant masks (SW1-3), and split-gate separators (INS1-3) which may include one or more additional masks to selectively implant the indicated p+, n+ source/drain, n+ body contact, and lightly doped drain (LDD) regions in the SOI wafer substrate 101-113.

After forming the doped regions and isolation structures in the SOI wafer 101-113, electrical interconnects are formed over the wafer surface to connect the gate electrodes G1-G6 and source/drain contacts as shown. As will be appreciated, the electrical interconnects may be defined silicide layers and connecting metallization conductors (MC1-MC3) which are formed with one or more metal materials or layers, including, for instance, an Ohmic metal layer, a transition layer, and a conduction layer. In particular, a first connecting metallization conductor MC1 connects the gate electrodes G1, G2 into a first split-gate electrode, while a second connecting metallization conductor MC2 connects the gate electrodes G3, G4 into a second split-gate electrode for the dummy HV PLDMOS device 121. In similar fashion, a third connecting metallization conductor MC3 connects the gate electrodes G5, G6 into a third split-gate electrode for the main HV PLDMOS device 122. Formed in a stack of dielectric layers (not shown), the metal layers electrically connect the conductive DTI poly contact 108 (and wafer substrate 101) to a ground reference potential (GND), and also electrically connect the drain D1 of the dummy HV PLDMOS device 121 to the ground reference potential (GND). In addition, the metal interconnect layers provide conductive paths to the terminals of the dummy HV PLDMOS 121 (including the first source terminal S1, split-gate electrodes G1/G2, G3/G4, and second source terminal S2) and the main HV PLDMOS 122 (including the shared second source terminal S2, split-gate electrode G5/G6, and second drain terminal D2). As disclosed herein, the circuit and connectivity elements may be included in the packaged integrated circuit device to provide functional and electrical features to the customer. Though FIG. 1 illustrates a split-gate embodiment, it will be appreciated that the present disclosure also contemplates that conventional, continuous single poly gate structures may be used to achieve the benefits provided herein.

With the depicted connection of the dummy HV PLDMOS 121 and the main HV PLDMOS 122, the operation voltage of the main HV PLDMOS 122 is extended by positioning and connecting the dummy HV PLDMOS 121 to reduce the electric potential near the buried insulator layers located in the integrated circuit, such as DTI insulator layers 107 and/or SOI insulator layers 102. To this end, the n-type wafer substrate 101 is grounded via the heavily doped n-type poly plug 108 in the center of DTI structure 107/108. To provide electrical isolation from neighboring devices, each of the main PLDMOS devices 122 surrounded by and contained within the DTI structure 107/108 and the buried oxide (BOX) layer 102. In addition, the main PLDMOS devices 122 is enclosed and encircled by the dummy HV PLDMOS structure 121 which has a similar design as the active HV PLDMOS structure 122 and which is positioned adjacent to the DTI structure 107/108. Under the dummy and main HV PLDMOS structures 121, 122, the LNBL layer 103 is disposed across the entire structure and is coupled to the body potential via the n-body implant region(s) 109A/B. In addition, the p-drift regions 105, 106 are enclosed on the sides by the n-body implants 109A/B and underneath by the LNBL layer 103.

With the device breakdown voltage typically being determined by the vertical p-n junction between the p-drift region 105, 106 and the LNBL layer 103, a split gate design may be employed to achieve a high breakdown voltage and to mitigate the influence of the silicon defects along the shallow trench isolation (STI) sidewall 110-113 on the device performance. With the split-gate design, the first gate (e.g., G1) is placed above the channel region portion of the n-body implant (e.g., 109A), whereas the second gate or "poly flap" (e.g., G2) is positioned above the STI (e.g., STI 111). The poly flaps G2, G3, G6 in the dummy and active devices 121, 122 may be optimized separately to achieve a high breakdown voltage. For improved protection against electric potential near the DTI sidewall insulator 107, the buffering p-epi layer 104 is positioned between the DTI structure 107/108 and the n-body of 109A dummy HV PLDMOS device(s) 121 to have a minimum specified width dimension W1 (e.g., 0.1-10 microns). To physically and/or electrically connect the dummy HV PLDMOS devices 121 into a single guard structure around the array of main HV PLDMOS devices 122, the dummy HV PLDMOS devices 121 may be positioned adjacent to the DTI structures 107/108 and connected together in a connection or wrap-around design that is arrayed around the array of main HV PLDMOS devices 122.

In the disclosed dummy HV PLDMOS device 121, the p+ source/body S1 and gate terminals G1/G2 are tied to the p+ source/body terminal of the main HV PLDMOS device 122 via the N-body implants 109 and LNBL layer 103, whereas the drain terminal D1 in the dummy HV PLDMOS device 121 is tied to the ground rail (GND). With this arrangement, the application of different $V_{SD}$ bias voltages to the main HV PLDMOS 122 will result in different electrostatic potentials in the LNBL layer 103, as illustrated with the electrostatic potential depletion lines $V_{SD1}$-$V_{SD3}$.

For example, under a low-side bias condition where the drain D2 of the main HV PLDMOS 122 is grounded and the source/body S2 and gate terminals G5/G6 of the active or main HV PLDMOS 122 are swept up to high voltages, the simulated electrostatic potential of the disclosed dummy HV PLDMOS 121 and main HV PLDMOS 122 at different low-side bias conditions is illustrated with the depletion lines $V_{SD1}$-$V_{SD3}$. In particular, the simulated electrostatic potential of the disclosed dummy HV PLDMOS 121 and main HV PLDMOS 122 at a first source-drain voltage low bias condition (e.g., Vsd=40V) is illustrated with the depletion lines $V_{SD1}$=40V. Under the first source-drain voltage low bias condition, the depletion line $V_{SD1}$=40V identifies the boundary of depletion regions, so it can be seen that there is no substantial depletion at the n-body implants 109A/B, the LNBL layer 103, and the barrier p-epi layer 104 (including the areas immediately adjacent to the DTI structure 107/108), meaning that the potential at the DTI sidewall 107 follows the source voltage at S1/S2.

However, when the source-drain voltage bias condition Vsd exceeds a critical value, the LNBL layer 103 starts to be depleted. This is illustrated with the simulated electrostatic potential depletion line $V_{SD2}$=80V of the disclosed dummy HV PLDMOS 121 and main HV PLDMOS 122 for a second, intermediate source-drain voltage low bias condition (e.g., Vsd=80V). With the depletion line $V_{SD2}$=80V showing the boundary of depletion regions at this intermediate bias condition, it can be seen that there is no substantial depletion at the n-body implants 109A/B. However, the central part of the LNBL layer 103 is fully depleted. In addition, the peripheral part of the LNBL layer 103 and the barrier p-epi layer 104 immediately adjacent to the DTI structure 107/108 are partially depleted.

In addition, the simulated electrostatic potential of the disclosed dummy HV PLDMOS 121 and main HV PLDMOS 122 at a third source-drain voltage high bias condition (e.g., Vsd=120V) is illustrated with the depletion lines $V_{SD3}$=120V. With the depletion line $V_{SD3}$=120V showing the boundary of depletion regions at this bias condition, it can be seen that there is no substantial depletion at the n-body implants 109A/B, but the LNBL layer 103 and the barrier p-epi layer 104 immediately adjacent to the DTI structure 107/108 are fully depleted, meaning that there is a voltage drop in the barrier p-epi layer 104 which reduces the potential near the DTI sidewall 107.

As will be appreciated, the metallization conductors MC1-MC3 enable the split gate electrodes G1/G2 and G3/G4 to be directly, electrically connected, respectively, to the p+ source regions S1, S2, such as by using a metal line or interconnect. In turn, the p+ source regions S1, S2 are directly, electrically connected to the n-body regions 109. However, in other embodiments, the portions of the split gate electrodes are separately connected to different potentials, in which case the metallization conductors MC1-MC3 are modified or removed to allow such separate electrical connections. For example, the metallization conductors MC1-MC3 may be removed or not formed in embodiments where the gate electrode portions G1/G4 are tied or directly, electrically connected with the p+ source regions S1, S2, but where the gate electrode flap portions G2/G3 are tied or directly, electrically connected with the gate terminal of the main device or with another bias voltage (e.g., logic supply voltage).

Figure 2:
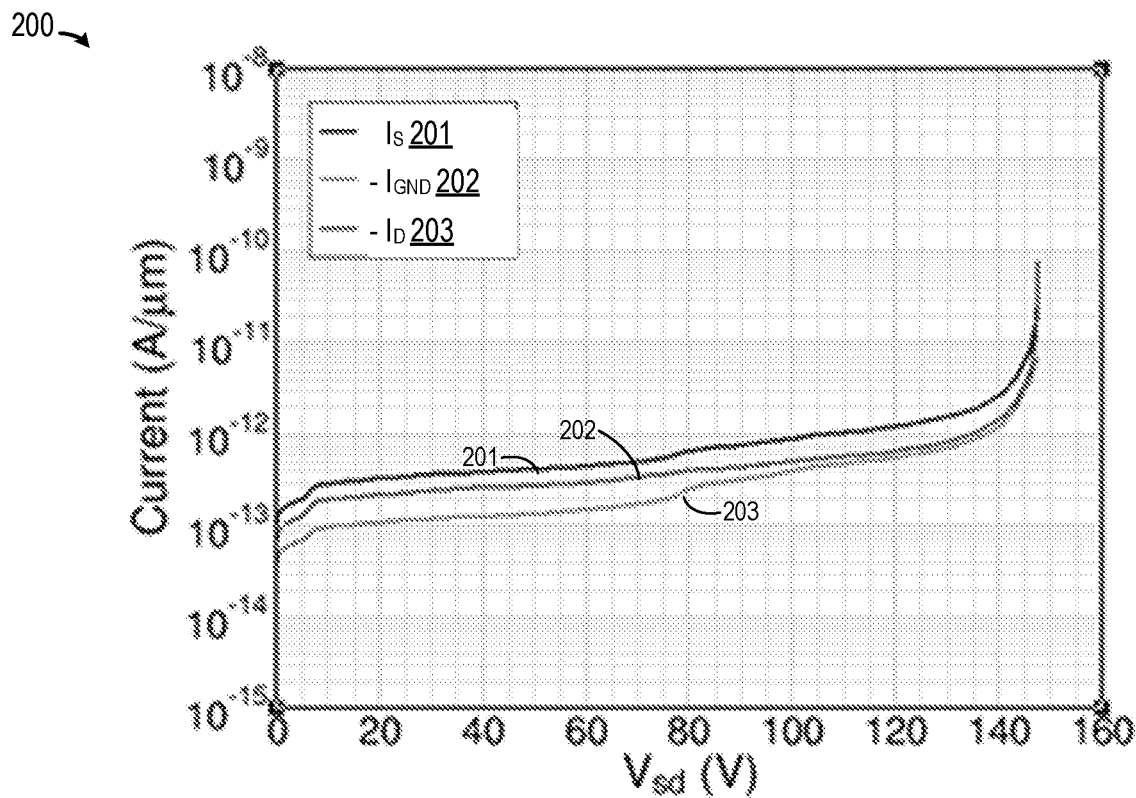
FIG. 2 is a plot showing a simulated current in source and drain of the main high voltage PLDMOS and the current from the ground terminal in the high voltage LDMOS dummy device during a low-side breakdown event in accordance with selected embodiments of the present disclosure.

To provide additional details for an improved understanding of selected embodiments of the present disclosure, reference is now made to FIG. 2 which depicts a plot 200 showing a simulated source, drain, and ground currents during a low-side breakdown event for a simulated structure such as shown in FIG. 1 having a main high voltage PLDMOS device which is protected by a high voltage LDMOS dummy device. The depicted plot illustrates the simulated currents at the source ($I_S$) 201, ground ($-I_{GND}$) 202, and drain ($-I_D$) 203 terminals during the low-side breakdown event at a breakdown voltage of 147V, in which the main HV PLDMOS device's source current $I_S$ flows to the drain $I_D$ and ground terminals $I_{GND}$. In the simulated structure of FIG. 1 where there are two dummy gate fingers (G1/G2 and G3/G4) and one active gate finger (G5/G6) in the simulation domain, the simulated ground terminal current ($-I_{GND}$) 202 is higher than the drain current ($-I_D$) 203, and the simulated low-side breakdown voltage for this novel device is about 147V.

Figure 3:
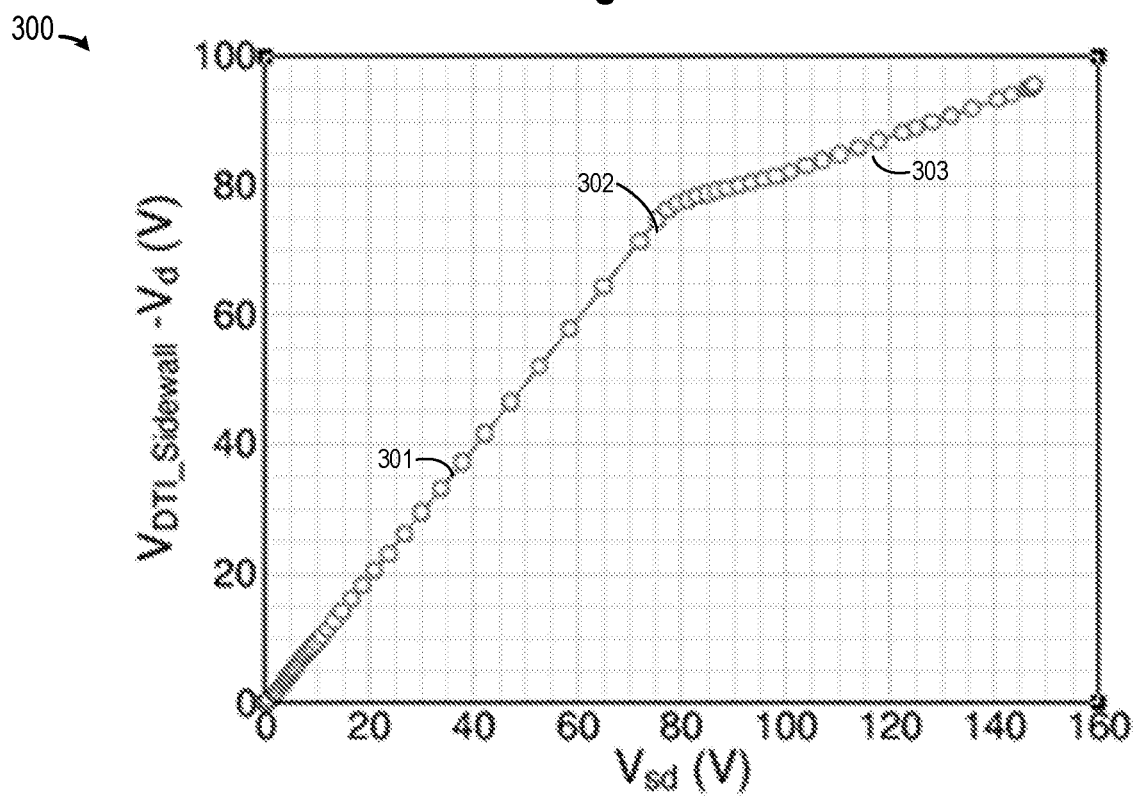
FIG. 3 is a plot showing a simulated deep trench isolation sidewall potential as a function of source-to-drain voltage $V_{SD}$ under a low-side bias condition in accordance with selected embodiments of the present disclosure.

To provide additional details for an improved understanding of selected embodiments of the present disclosure, reference is now made to FIG. 3 which depicts a plot 300 showing a simulated deep trench isolation sidewall potential ($V_{DTI\_Sidewall}$) as a function of source-to-drain voltage $V_{SD}$ under a low-side bias condition. As shown in the plot of the DTI sidewall potential, there are two distinct slopes. In a first section 301 when the Vsd is less than 75V, the DTI sidewall potential exactly follows the source voltage and the curve exhibits a slope of 1. However, after an inflection point 302 when the Vsd exceeds 75V, the increase in DTI sidewall potential slows down and the curve 303 shows a slope of less than 1. As a result, the DTI sidewall potential is lower than the source-to-drain voltage. At the breakdown voltage of 147V, the DTI sidewall potential is lower than 98V, effectively eliminating the DTI structure as the limiting factor. Referring back to FIG. 1, when the LNBL layer 103 is depleted at the higher source-to-drain voltage $V_{SD}$, a certain voltage drop occurs in the buffering p-epi layer 104 between the n-body 109A of the dummy device and the DTI structure 107/108 to reduce the potential near the DTI sidewall 107, thereby causing the slope 303 in FIG. 3 to decrease.

Figure 4:
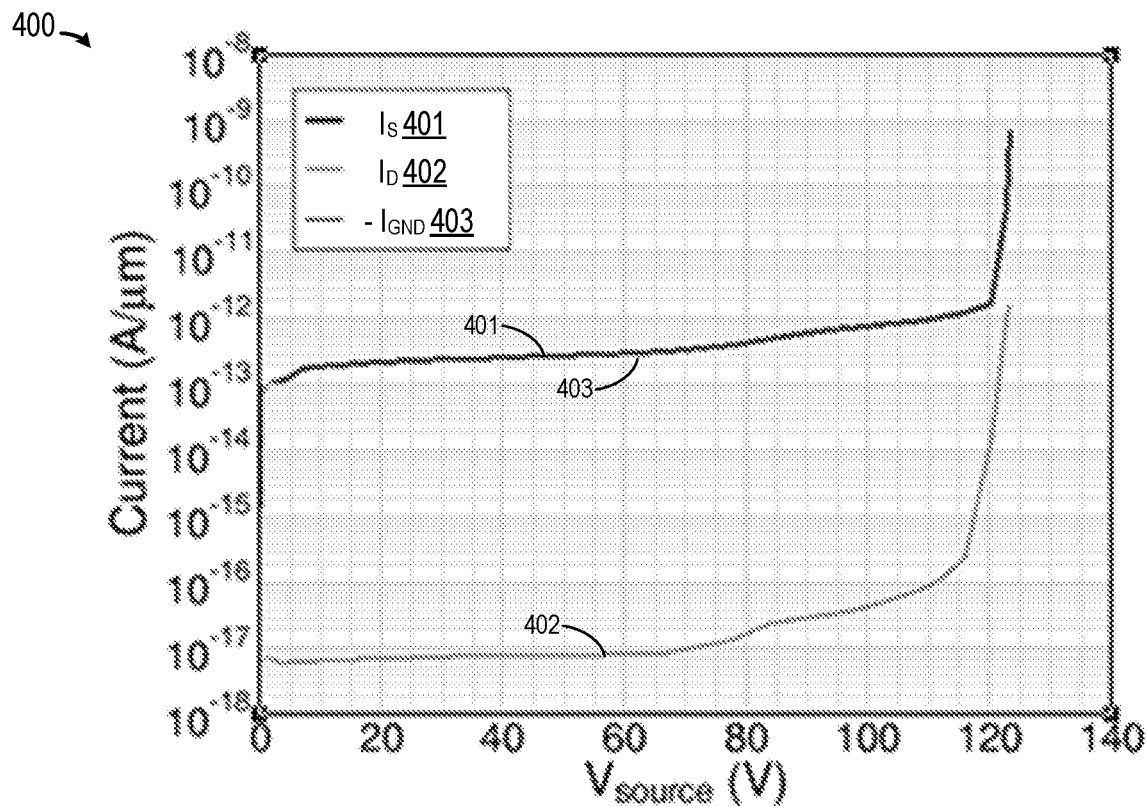
FIG. 4 is a plot showing simulated current in source and drain of the main high voltage LDMOS, and current in from the ground terminal in the high voltage LDMOS dummy device during a high-side bias condition in accordance with selected embodiments of the present disclosure.

To provide additional details for an improved understanding of selected embodiments of the present disclosure, reference is now made to FIG. 4 which depicts a plot 400 showing a simulated source, drain, and ground currents during a high-side breakdown event for a simulated structure such as shown in FIG. 1 having a main high voltage PLDMOS device which is protected by a high voltage PLDMOS dummy device. The depicted plot illustrates the simulated currents at the source ($I_S$) 401, ground ($-I_{GND}$) 402, and drain ($I_D$) 403 terminals are biased with a high potential applied to the gate voltage ($V_G$) at gate electrode G5/G6, source voltage ($V_S$) at the source terminal S2, and drain voltage ($V_D$) at the drain terminal D2 of the main HV PLDMOS device 122. In the simulated plot 400, the simulated source current ($I_S$) 401 and ground current ($-I_{GND}$) current track together ahead of the drain current ($I_D$) to provide a high side capability up to 120V.

Figure 5:
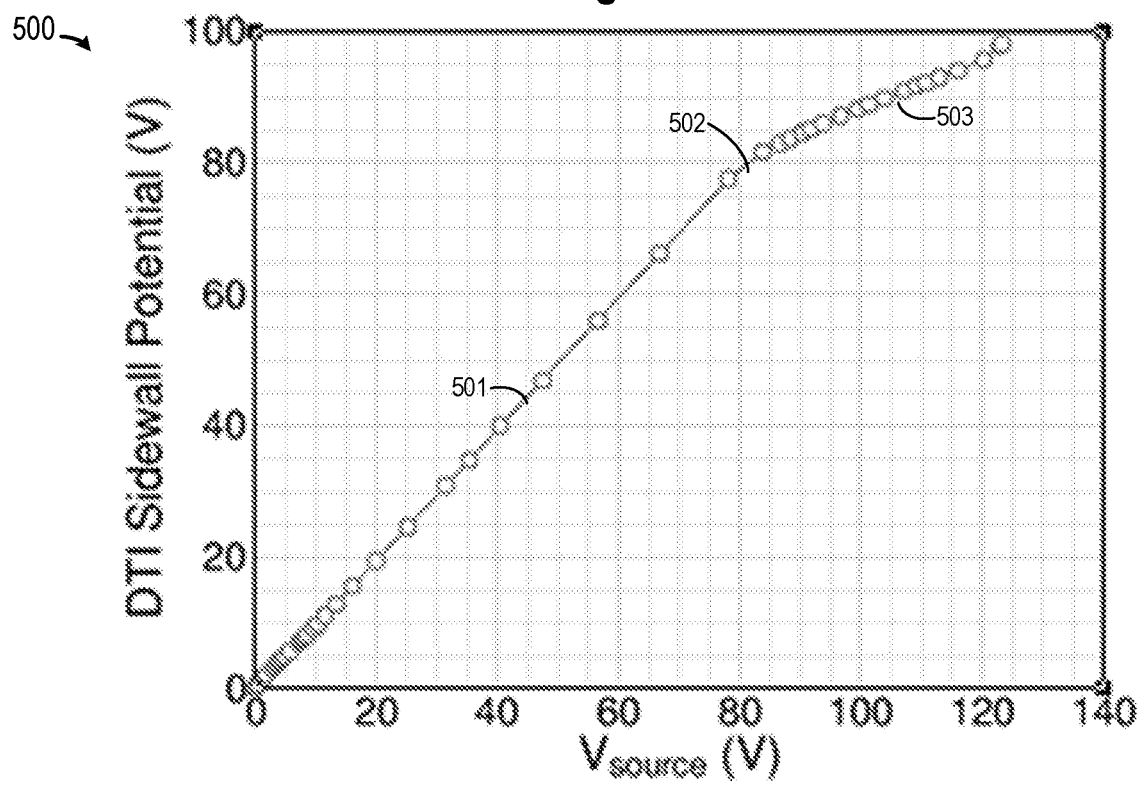
FIG. 5 is a plot showing a simulated deep trench isolation sidewall potential as a function of source-to-drain voltage $BV_{DSS}$ under a high-side bias condition in accordance with selected embodiments of the present disclosure.

To provide additional details for an improved understanding of selected embodiments of the present disclosure, reference is now made to FIG. 5 which depicts a plot 500 showing a simulated deep trench isolation sidewall potential ($V_{DTI\_Sidewall}$) as a function of the source/body voltage $V_S$ under a high-side bias condition. As shown in the plot of the DTI sidewall potential, there are two distinct slopes, including a first section 501 when the source/body voltage $V_S$ is less than 80V where the DTI sidewall potential exactly follows the source voltage and the curve exhibits a slope of 1. However, after an inflection point 502 when the source/body voltage $V_S$ exceeds 80V, the increase in DTI sidewall potential slows down and the curve 503 shows a slope of less than 1. As a result of the depletion in the buffering p-epi layer, there is a voltage drop between the body of the dummy PLDMOS and the DTI, which effectively reduces the DTI sidewall potential to below 98V, even when the source/body voltage $V_S$ increases to 120V. Therefore, the disclosed HV PLDMOS extends the operation voltage to 106V or even 114V without any process changes. Such enhancement is accomplished by employing an "always OFF" dummy PLDMOS device to create an adequate potential drop towards the DTI structure. Although it does require a small additional silicon area for the dummy PLDMOS device, this increase in footprint is justified in many applications where a higher voltage blocking capability is required but the overall usage of such high voltage device is relatively low that it does not justify the significant development cost and/or cycle time for a new technology with more competitive BV/Rdson figure of merit. In most applications, the power devices are usually adopted to deliver large currents which typically requires large device size, i.e., having large device width and multiple fingers. In this case, an increase of the device size due to peripheral dummy devices would be minimal.

Figure 6:
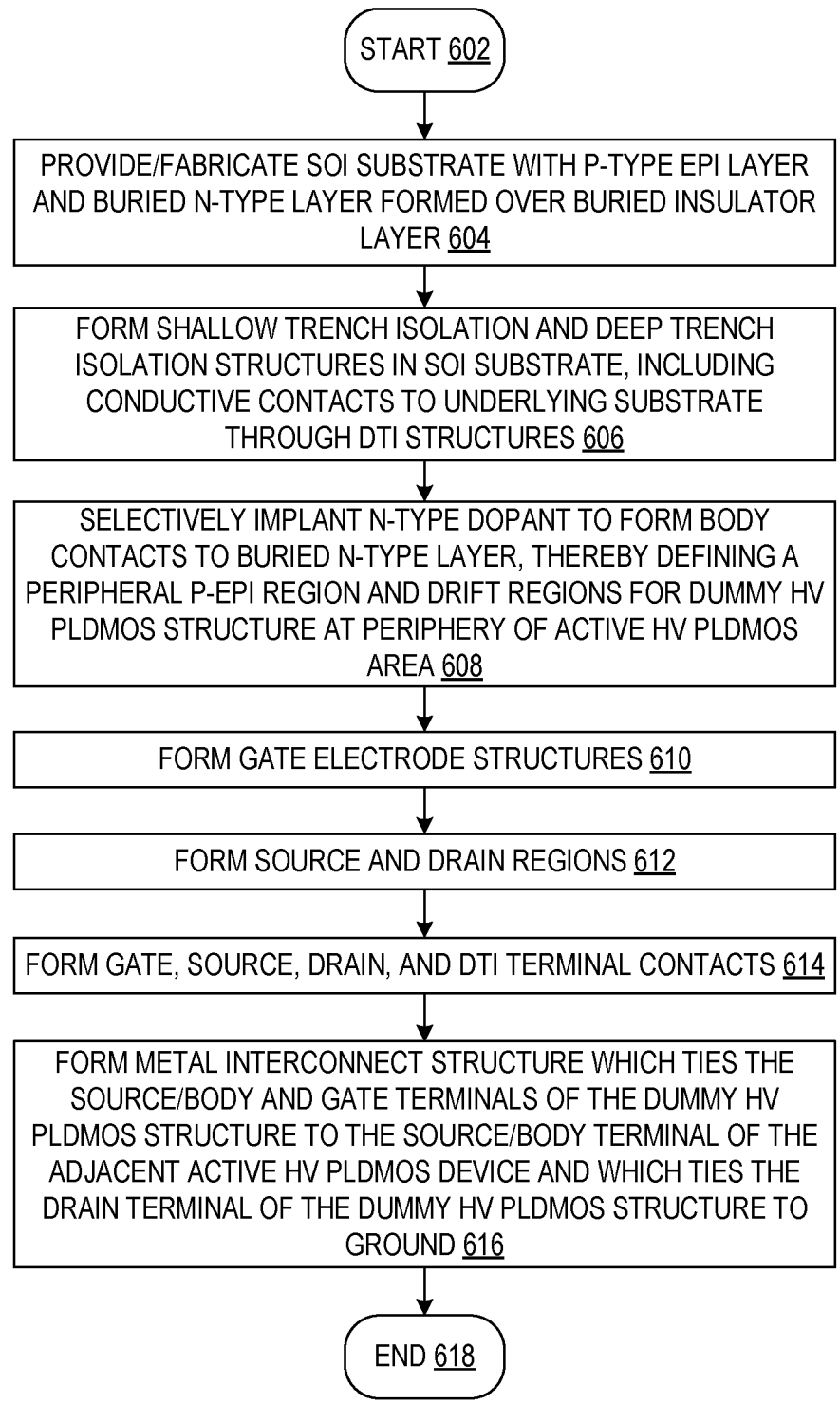
FIG. 6 is a simplified schematic flow chart illustrating a method for fabricating devices in accordance with selected embodiments of the invention.

To provide additional details for an improved understanding of selected embodiments of the present disclosure, reference is now made to FIG. 6 which depicts a simplified flow chart showing the process flow for fabricating a semiconductor device having LDMOS devices with extended operation voltage. After the process starts at step 602, a sequence of fabrication steps are performed at step 604 to provide or fabricate a semiconductor-on-insulator (SOI) wafer substrate having a p-type epitaxial layer formed over a buried n-type layer and buried insulator layer, where the buried insulator layer separates the underlying n-type semiconductor substrate from the p-type epitaxial layer and buried n-type layer.

With respect to the fabrication step 604, there may be a number of preliminary steps be directed to preparing a wafer substrate for subsequent processing. Any bulk or composite substrate may be used as a starting material, though in selected embodiments, an SOI wafer substrate is fabricated which includes an underlying wafer substrate, buried insulator layer, and epitaxial semiconductor layer. In selected embodiments, the epitaxial semiconductor layer is formed with a first, lightly doped n-type layer over the buried insulator layer, followed by epitaxial formation of a second, p-type epitaxial layer formed over the first, lightly doped n-type layer. Alternatively, the epitaxial semiconductor layer may be formed as a p-type epitaxial layer over the buried insulator layer, followed by implantation of n-type impurities to form a lightly doped n-type buried layer.

At step 606, active device regions are defined and delineated in the epitaxial semiconductor layer by forming shallow trench isolation and deep trench isolation structures in the SOI substrate, including conductive contacts to underlying n-type semiconductor substrate through the deep trench isolation structures. In particular, the deep trench isolation structures are formed to extend from the surface of the SOI wafer substrate down to the underlying wafer substrate. To form each deep trench isolation (DTI) structure, a deep trench opening is formed using any suitable sequence of steps to selectively mask and etch through the p-type epitaxial layer, buried n-type layer, and buried insulator layer, such as by using a patterned mask with one or more anisotropic etch steps to form the deep trench opening. The DTI is filled with highly doped poly plug surrounded by one or multiple dielectric layers. If needed, one or more processing steps may be applied to planarize the deep trench isolation structure with the remainder of the SOI substrate, such as by applying a polish step to the surface of the SOI substrate. As will be appreciated, the deep trench isolation structure may be formed and positioned to surround and protect a first active device region wherein the high voltage PLDOS transistor devices will subsequently be formed. In the active device regions, one or more shallow trench isolation structures may be formed by patterning and etching shallow trench openings in the upper surface of the SOI substrate, filling the openings with one or more insulating dielectric layers, and then polishing or planarizing the filling layers down to the surface of the substrate to form the shallow trench isolation (STI) structures.

Beginning at step 608, additional steps are performed to fabricate additional well regions, gate electrodes, and associated source/drain regions in the active region on the surface of the SOI wafer substrate. In particular, body contact regions may be formed by selectively implanting n-type dopants at the surface of the SOI substrate which extend down to contact the buried n-type layer. As will be appreciated, any suitable sequence of steps may be used to form each body contact region, such as by patterning an implant or diffusion mask with openings over the intended body contact regions, and then implanting or diffusing n-type impurities with a predetermined dopant concentration and implant energy to form the n-type body contact. By positioning the n-type body contacts in the p-type epitaxial layer, a peripheral p-epi region and drift regions and RESURF structure are defined for the dummy HV PLDMOS structures at periphery of active HV PLDMOS area. In particular, a first n-type body contact region may be positioned adjacent to but spaced apart from the DTI structure by minimum specified width dimension W1 (e.g., 0.1-10 microns) to create a buffering p-type epitaxial layer which provides improved protection against electric potential near the DTI sidewall insulator. To physically and/or electrically connect the subsequently formed dummy HV PLDMOS devices into a single guard structure around the array of main HV PLDMOS devices, the buffering p-type epitaxial layer is positioned adjacently between the DTI structures and the subsequently formed dummy HV PLDMOS devices in a connection or wrap-around design that is arrayed around the array of subsequently formed main HV PLDMOS devices. If desired, additional well regions may be formed by doping the epitaxial semiconductor substrate layer with any suitable dopant implantation procedure to define a n-type or p-type well regions.

At step 610, gate electrode structures are formed over the SOI structure in at least the active device area enclosed and encircled by the deep trench isolation structures. While any suitable sequence of steps may be used to form gate electrode structures, an example fabrication sequence includes forming or depositing one or more gate dielectric layers over the SOI substrate, and then forming one or more conductive gate electrode layers over the gate dielectric layer(s), such as by depositing a doped polysilicon layer over the SOI substrate. By then patterning an etch mask and then applying one or more selectively etch steps to the conductive gate electrode layer(s) and gate dielectric layer(s), gate electrode structures are formed over the active region. As formed, the gate electrode structures are positioned to define dummy gate electrodes for the dummy HV PLDMOS devices (e.g., G1/G2 and G3/G4) and active gate electrodes for the main HV PLDMOS devices (e.g., G5/G6).

At step 612, source and drain regions are formed in the upper surface of the SOI substrate in at least the active device area. As will be appreciated, any suitable sequence of steps may be used to form the source/drain regions, such as by patterning an source/drain implant or diffusion mask with openings over the intended source/drain regions, and then implanting or diffusing p-type impurities with a predetermined dopant concentration and implant energy to form the p+ source/drain region. As will be appreciated, the implant or diffusion mask may include one or more sidewall implant masks formed on the sidewall of a gate electrode, such as by forming an insulating layer over the gate electrode structures which is then anisotropically etched to leave the sidewall implant masks. The implant or diffusion mask may also include an additional patterned implant mask, depending on the desired location and type of source/drain region. For example, an implant mask may be formed to protect all or part of the barrier p-epi layer and p-drift regions from the source/drain implantation step prior to forming the sidewall implant masks, thereby enabling one or more lightly doped drain (LDD) regions to be selectively formed with a first source/drain implantation on one side of a gate electrode structure, followed by formation of the sidewall implantation masks for use with a second source/drain implantation to form the P+ source/drain regions located to be completely contained within the n-body region, and the P+ drain region located in the p-drift region to be spaced apart from the n-body region. After formation of the source/drain regions, the active device area includes a high voltage dummy PLDMOS transistor and buffering p-epi layer formed adjacent to an encircling deep trench isolation (DTI) structure for use with protecting an array of high voltage main PLDMOS transistors formed at an interior, protected position of the active device area. Formed as a ring adjacent to the DTI structure, the dummy PLDMOS transistors and buffering p-epi layer are positioned and connected to reduce the electric field across the DTI sidewall by tying the gate, source and body of the dummy PLDMOS transistors to the source and body of the array of PLDMOS transistors and by tying the drain of the dummy PLDMOS transistor to ground. In such a configuration, the dummy PLDMOS transistors are always OFF. In selected embodiments, the disclosed dummy PLDMOS transistor and the main PLDMOS transistors may be similarly constructed and have similar breakdown voltages, though the dummy PLDMOS transistors may include a split gate design where the placement and size of the gate electrodes are controlled or optimized to achieve a high breakdown voltage.

After forming the gate electrode structures and doped source/regions, terminal contacts are formed for the gate, source, drain and deep trench isolation contact regions at step 614. As will be appreciated, the terminal contacts may be formed using any suitable contact formation sequence, such as by selectively forming silicide layers with a patterned mask so that a layer of deposited metal is formed to make contact with the gate, source, drain and DTI contact regions, and then annealed to form a silicide layer for subsequent electrical connection to metallization conductors formed in an interconnect stack over the SOI substrate.

At step 616, a metal interconnect structure is formed over the SOI substrate which ties the source/body and gate terminals of the dummy HV PLDMOS structure to the source/body terminal of the adjacent active HV PLDMOS device and which ties the drain terminal of the dummy HV PLDMOS structure to ground. The processing at step 616 may include the sequential formation of inter-dielectric layers and patterned metal interconnect conductors to make direct electrical connection with the gate, source, drain, and DTI terminal contacts.

At step 618, the fabrication methodology ends. At this point, the fabrication of the semiconductor device may continue with singulation into individual integrated circuit die and additional packaging steps. Of course, the order of the acts described above may vary to form specific device regions and features needed for any particular integrated circuit application. It will be appreciated that additional processing steps will be used to fabricate the semiconductor device described herein, such as a nitride strip process, preparation and formation of one or more sacrificial oxide layers, shallow trench isolation regions, and formation of various buried well or regions. In addition, other circuit features may be formed on the wafer structure, such as capacitors, diodes, etc. As examples, one or more sacrificial oxide formation, stripping, isolation region formation, well region formation, gate dielectric and electrode formation, extension implant, halo implant, spacer formation, source/drain implant, heat drive or anneal steps, and polishing steps may be performed, along with conventional backend processing (not depicted), typically including formation of multiple levels of interconnect that are used to connect the transistors in a desired manner to achieve the desired functionality. Thus, the specific sequence of steps used to complete the fabrication of the semiconductor structures may vary, depending on the process and/or design requirements.

By now it should be appreciated that there is provided herein a laterally diffused MOS semiconductor device and method for fabricating same. The disclosed semiconductor device includes a semiconductor substrate (which may be a SOI substrate) having an upper semiconductor layer having an upper surface and a first conductivity type and a second buried semiconductor layer or region having a second, opposite conductivity type. In selected embodiments, the first conductivity type is p-type, and the second, opposite conductivity type is n-type. In other embodiments, the upper semiconductor layer is an epitaxial p-type layer and the second buried semiconductor layer is a lightly doped n-type buried layer formed between the epitaxial p-type layer and the buried insulator layer. The semiconductor device also includes a deep trench isolation structure having a conductive contact structure or layer and a sidewall insulator formed in the semiconductor substrate to extend from the upper surface of the semiconductor substrate into the semiconductor substrate, thereby defining an active device region disposed at the upper surface of the semiconductor substrate on one side of the deep trench isolation structure. In selected embodiments, the conductive contact layer of the deep trench isolation structure is grounded to bias the underlying substrate. In addition, the semiconductor device includes a first dummy lateral-diffused-metal-oxide-semiconductor (LDMOS) device positioned in the active device region. As formed, the first dummy LDMOS device includes a drain region located in a drift region of the upper semiconductor layer and connected to a predetermined reference voltage, such as ground. The first dummy LDMOS device also includes a source region located in a body region which extends through the upper semiconductor layer to contact the second buried semiconductor layer. In addition, the first dummy LDMOS device includes a gate electrode formed over the upper semiconductor layer between the drain region and source region wherein at least part of the gate electrode is directly, electrically connected with the source region (and thereby, the body region), such as by using a metal line or interconnect which connects the gate electrode (portion) to the source region. In selected embodiments, the gate electrode in the first dummy LDMOS device is a split gate electrode that includes a first gate portion positioned above a channel region in the body region, and a second gate flap portion positioned above a shallow trench isolation region formed in the drift region of the upper semiconductor layer. In other embodiments, the gate electrode in the first dummy LDMOS device is a single continuous poly electrode. The first dummy LDMOS device also includes a buffering portion of the semiconductor layer at the upper surface of the semiconductor substrate which is adjacent the deep trench isolation structure. The semiconductor device also includes one or more active LDMOS devices positioned in the active device region to be separated from the deep trench isolation structure by the first dummy LDMOS device which reduces an electric field across the sidewall insulator layer in the deep trench isolation structure. In selected embodiments, the deep trench isolation structure and first dummy LDMOS device are formed as concentric rings to encircle the one or more active LDMOS devices positioned in the active device region. In selected embodiments, the dimensions of the first gate portion and second gate flap portion of the gate electrode in the first dummy LDMOS device differ from dimensions of split gate electrodes in the one or more active LDMOS devices. In other embodiments, the first gate portion and second gate flap portion of the gate electrode in the first dummy LDMOS device have the same device geometries as split gate electrodes in the one or more active LDMOS devices. In selected embodiments, the first gate portion and second gate flap portion of the split gate electrode are tied with a source/body of the one or more active LDMOS devices. In other embodiments, the first gate portion of the split gate electrode is tied with a source/body of the one or more active LDMOS devices, and the second gate flap portion of the split gate electrode is tied with a gate terminal of the one or more active LDMOS devices.

In another form, there is provided herein a semiconductor device and method for fabricating same. In the disclosed methodology, a semiconductor substrate is formed to include an upper semiconductor layer having an upper surface and a first conductivity type, and a second buried semiconductor layer having a second, opposite conductivity type. In selected embodiments, the upper semiconductor layer is an epitaxial p-type layer and the second buried semiconductor layer is a lightly doped n-type buried layer. Around an active device region disposed at the upper surface of the semiconductor substrate, a deep trench isolation structure is formed that includes a conductive contact layer surrounded by a sidewall insulator formed in the semiconductor substrate to extend from the upper surface of the semiconductor substrate into the semiconductor substrate. In addition, a dummy lateral-diffused-metal-oxide-semiconductor (LDMOS) device is formed that is positioned in the active device region at a peripheral location adjacent to the deep trench isolation structure to surround one or more active LDMOS devices positioned in the active device region. In selected embodiments, the deep trench isolation structure and dummy LDMOS device are formed as concentric rings to encircle the one or more active LDMOS devices positioned in the active device region. In forming the dummy LDMOS device, dopants of the second conductivity type are selectively implanted into the upper surface of the semiconductor substrate to form first and second body regions to contact the second buried layer, thereby defining a peripheral buffering region in the upper semiconductor layer positioned between the deep trench isolation structure and the first body region, and a drift region in the upper semiconductor layer positioned between the first and second body regions. The formation of the dummy LDMOS device also includes forming a first shallow trench isolation structure in the upper surface of the semiconductor substrate to cover the peripheral buffering region, and forming at least a second shallow trench isolation structure in the upper surface of the semiconductor substrate to cover a portion of the drift region except for a central drain region opening. The formation of the dummy LDMOS device also includes forming first and second gate electrodes are formed over the semiconductor substrate, where the first gate electrode covers a first part of the drift region and at least part of the first body region to define a first channel region inside the first body region, and where the second gate electrode covers a second part of the drift region and at least part of the second body region to define a second channel region inside the second body region. In selected embodiments, the first gate electrode is formed with a first gate portion positioned above the first channel region and with a second gate flap portion positioned above at least part of the second shallow trench isolation structure, and the second gate electrode is formed with a third gate portion positioned above the second channel region and with a fourth gate flap portion positioned above at least part of the second shallow trench isolation structure. In other embodiments, the first gate electrode is formed with a first single continuous poly electrode positioned above the first channel region and above at least part of the second shallow trench isolation structure, and the second gate electrode is formed with a second single continuous poly electrode positioned above the second channel region and above at least part of the second shallow trench isolation structure. The formation of the dummy LDMOS device also includes selectively implanting dopants of the first conductivity type into the upper surface of the semiconductor substrate to simultaneously form a drain region located in the central drain region, a first source region formed in the first body region adjacent to the first gate electrode, and a second source region formed in the second body region adjacent to the second gate electrode. In selected embodiments, the method includes forming a set of interconnects over the semiconductor substrate to include a first set of interconnects to connect the drain region of the dummy LDMOS device to a ground voltage, and a second set of interconnects to connect the first and second gate electrodes to the first and second source regions, respectively. In other embodiments, the method includes forming a set of interconnects over the semiconductor substrate to include a first set of interconnects to connect the drain region of the dummy LDMOS device to a ground voltage, a second set of interconnects to connect the first and third gate portions to a source/body of the one or more active LDMOS devices, and a third set of interconnects to connect the second and fourth gate flap portions to a gate terminal of the one or more active LDMOS devices. In other embodiments, the method includes forming a set of interconnects over the semiconductor substrate to include a first set of interconnects to connect the drain region of the dummy LDMOS device to a ground voltage, and a second set of interconnects to connect the first and second gate electrodes to a source/body of the one or more active LDMOS devices.

Although the described exemplary embodiments disclosed herein are directed to various isolated LDMOS transistors and methods for making same, the present invention is not necessarily limited to the example embodiments which illustrate inventive aspects of the present invention that are applicable to a wide variety of transistor fabrication processes and/or structures. Thus, the particular embodiments disclosed above are illustrative only and should not be taken as limitations upon the present invention, as the invention may be modified and practiced in different but equivalent manners apparent to those skilled in the art having the benefit of the teachings herein. For example, while the various devices illustrated herein are for P-channel LDMOS transistor devices or the like, this is merely for convenience of explanation and not intended to be limiting and persons of skill in the art will understand that the principles taught herein apply to devices of either conductivity type. In addition, the body contact regions are described as being formed by implanting n-type dopants into a p-type upper semiconductor layer, but the inverse approach could instead be used to form p-type buffer and drift regions by implanting p-type dopants into an n-type upper semiconductor layer, thereby leaving body contact regions as un-implanted portions of the n-type upper semiconductor layer. Accordingly, the identification of particular regions as N-type or P-type is merely by way of illustration and not limitation and opposite conductivity type regions may be substituted in order to form devices of opposite conduction type. Moreover, the thicknesses and doping concentrations of the described layers may be adjusted as required for the required application. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A semiconductor device, comprising:
    a semiconductor substrate comprising an upper semiconductor layer having an upper surface and a first conductivity type and a second buried semiconductor layer having a second, opposite conductivity type;
    a deep trench isolation structure comprising a conductive contact structure and a sidewall insulator formed in the semiconductor substrate to extend from the upper surface of the semiconductor substrate into the semiconductor substrate, thereby defining an active device region disposed at the upper surface of the semiconductor substrate on one side of the deep trench isolation structure;
    a first dummy lateral-diffused-metal-oxide-semiconductor (LDMOS) device positioned in the active device region, the first dummy LDMOS device comprising:
        a drain region located in a drift region of the upper semiconductor layer and connected to a predetermined reference voltage,
        a source region located in a body region which extends through the upper semiconductor layer to contact the second buried semiconductor layer, and
        a gate electrode formed over the upper semiconductor layer between the drain region and source region wherein at least part of the gate electrode is electrically connected with the source region, and
        a buffering portion of the upper semiconductor layer at the upper surface of the semiconductor substrate which is adjacent the deep trench isolation structure; and
    one or more active LDMOS devices positioned in the active device region to be separated from the deep trench isolation structure by the first dummy LDMOS device which reduces an electric field across the sidewall insulator layer in the deep trench isolation structure.

2. The semiconductor device of claim 1, where the first conductivity type comprises a p-type, and where the second, opposite conductivity type comprise n-type.

3. The semiconductor device of claim 1, wherein the conductive contact structure of the deep trench isolation structure is grounded to bias an underlying substrate layer.

4. The semiconductor device of claim 1, wherein the deep trench isolation structure and first dummy LDMOS device are formed as concentric rings to encircle the one or more active LDMOS devices positioned in the active device region.

5. The semiconductor device of claim 1, wherein the gate electrode in the first dummy LDMOS device comprises a single continuous poly electrode.

6. The semiconductor device of claim 1, wherein the gate electrode in the first dummy LDMOS device is a split gate electrode comprising:
    first gate portion positioned above a channel region in the body region, and
    a second gate flap portion positioned above a shallow trench isolation region formed in the drift region of the upper semiconductor layer.

7. The semiconductor device of claim 6, wherein the first gate portion and second gate flap portion are tied with a source/body of the one or more active LDMOS devices.

8. The semiconductor device of claim 6, wherein the first gate portion is tied with a source/body of the one or more active LDMOS devices, and where in the second gate flap portion is tied with a gate terminal of the one or more active LDMOS devices.

9. The semiconductor device of claim 6, wherein the first gate portion is tied with a source/body of the one or more active LDMOS devices, and where in the second gate flap portion is tied with another bias voltage.

10. The semiconductor device of claim 6, wherein the first gate portion and second gate flap portion of the gate electrode in the first dummy LDMOS device have the same device geometries as split gate electrodes in the one or more active LDMOS devices.

11. The semiconductor device of claim 6 wherein the dimensions of the first gate portion and second gate flap portion of the gate electrode in the first dummy LDMOS device differ from dimensions of split gate electrodes in the one or more active LDMOS devices.

12. The semiconductor device of claim 1, wherein the semiconductor substrate comprises a semiconductor on insulator (SOI) substrate comprising in which the upper semiconductor layer and second buried semiconductor layer are formed over and isolated from an underlying substrate by a buried insulator layer.

\* \* \* \* \*